United States Patent [19]

Liu

[11] Patent Number: 5,991,175
[45] Date of Patent: Nov. 23, 1999

[54] CONTROL CIRCUIT FOR AN IN-RUSH CURRENT CONTROL ELEMENT, AND A PROTECTION CIRCUIT AND POWER SUPPLY EMPLOYING THE SAME

[75] Inventor: Rui Liu, Plano, Tex.

[73] Assignee: Lucent Technologies Inc., Murray Hill, N.J.

[21] Appl. No.: 09/191,415

[22] Filed: Nov. 12, 1998

[51] Int. Cl.$^6$ .............................. H02H 7/122; H02H 3/00
[52] U.S. Cl. .............................. 363/56; 323/908; 361/101
[58] Field of Search ..................................... 323/220, 223, 323/908; 363/50, 56; 361/18, 87, 93, 101

[56] References Cited

U.S. PATENT DOCUMENTS

| | | | |
|---|---|---|---|
| 4,987,348 | 1/1991 | Wong | 315/307 |
| 5,303,114 | 4/1994 | Ferry et al. | 361/101 |
| 5,574,632 | 11/1996 | Pansier | 363/49 |
| 5,619,127 | 4/1997 | Warizaya | 323/908 |

*Primary Examiner*—Matthew Nguyen

[57] ABSTRACT

For use with a protection circuit having an in-rush current control element that controls in-rush current into a power converter, a control circuit, a method of controlling the in-rush current control element and a power supply employing the control circuit and method are provided. In one embodiment, the control circuit includes: (1) a sensor, coupled to the in-rush current control element, that senses an in-rush current through the in-rush current control element and produces an intermediate signal and (2) a controller, coupled to the sensor and the in-rush current control element, that controls the in-rush current control element to limit the in-rush current when the intermediate signal exceeds a first reference current signal and to substantially interrupt the in-rush current when the intermediate signal exceeds a second reference current signal.

20 Claims, 2 Drawing Sheets

CONTROL CIRCUIT FOR AN IN-RUSH CURRENT CONTROL ELEMENT, AND A PROTECTION CIRCUIT AND POWER SUPPLY EMPLOYING THE SAME

TECHNICAL FIELD OF THE INVENTION

The present invention is directed, in general, to power supplies and, more specifically, to a protection circuit having a control circuit for an in-rush current control element and a power supply employing the protection circuit.

BACKGROUND OF THE INVENTION

Many current power systems employ DC power supplies having DC/DC power converters located on circuit cards (e.g., load cards) which are directly coupled to voltage buses. The voltage buses generally supply voltages of a magnitude of around 40 V to 60 V. The load cards are usually coupled to the voltage bus and to a separate load.

For system reliability, the load cards should be able to connect to and disconnect from the voltage bus without disturbing the operation of other cards and the bus voltage. Furthermore, if a fault condition occurs in a card, other cards should be electrically isolated from the condition until the fault condition is remedied. Typically, an isolation diode and local bus capacitors are mounted on the cards to accomplish the electrical isolation.

Unfortunately, using local capacitors creates an in-rush current that occurs at the moment when the card is coupled to the voltage bus. The narrow-pulsed and high amplitude in-rush current commonly causes current stresses on the associated electrical components and electromagnetic interference in the system as a whole. Therefore, the current that rushes into the local bus capacitors must be introduced in a controlled manner. The in-rush current is commonly regulated using an RC timing circuit in conjunction with a switching component, such as a metal-oxide semiconductor field-effect transistor (MOSFET). The turn-on timing of the switch is controlled by the timing circuit. When the card is initially connected, the RC circuit begins charging and will slowly allow the switch to reach its turn-on threshold. As the switch turns on, the in-rush current is allowed, via the switch, to begin charging the capacitors at an acceptable rate.

The in-rush current, however, often cannot reach a satisfactory level due to component tolerances. For instance, the threshold voltage for turning on a MOSFET switch is normally about 2 VDC to about 4 VDC. Capacitance tolerances of the capacitor in the RC timing circuit are approximately ±20%. Furthermore, the charging rate of the capacitor is high at low capacitor voltages and low at high capacitor voltages. Therefore, at lower turn-on threshold voltages, the switch begins to conduct very quickly; conversely, the switch begins to conducts more slowly (i.e., less current) at high turn-on threshold voltages. When the switch turns on quickly, a dip in the bus voltage could occur. Such fluctuations in the bus voltage are unacceptable in systems that require high reliability.

When the in-rush current is too large, the switch will suffer a short circuit condition. A fuse is normally employed to protect against short circuit situations in higher reliability systems. When a fuse is connected in series with a semiconductor switching device, such as a MOSFET, it is not always able to detect a short circuit or protect the switch from damage.

Accordingly, what is needed in the art is a protection circuit capable of providing overvoltage, current limit and short circuit protection for a power converter that overcomes the deficiencies in the prior art.

SUMMARY OF THE INVENTION

To address the above-discussed deficiencies of the prior art, the present invention provides, for use with a protection circuit having an in-rush current control element that controls in-rush current into a power converter, a control circuit, a method of controlling the in-rush current control element and a power supply employing the control circuit and method.

In one embodiment, the control circuit includes: (1) a sensor, coupled to the in-rush current control element, that senses an in-rush current through the in-rush current control element and produces an intermediate signal and (2) a controller, coupled to the sensor and the in-rush current control element, that controls the in-rush current control element to limit the in-rush current when the intermediate signal exceeds a first reference current signal and to substantially interrupt the in-rush current when the intermediate signal exceeds a second reference current signal.

The present invention therefore introduces the broad concept of employing a control circuit that directs the in-rush current control element to limit or substantially interrupt the in-rush current based on particular conditions and to protect the power converter from the potential deleterious effects therefrom.

In one embodiment, the controller includes an intermediate control element that controls the in-rush current control element. In an advantageous embodiment, the intermediate control element may be a field-effect transistor (FET). In a related, but alternate embodiment, the sensor is a resistor. In yet another related, but alternate embodiment, the in-rush current control element is a metal-oxide semiconductor field-effect transistor (MOSFET). Switching devices, such as FETs, and resistors are well known in the art. Of course, the broad scope of the present invention is not limited to the use of the aforementioned devices.

In one embodiment, the controller includes a first comparator that compares the intermediate signal to the first reference current signal and develops a first control signal and a second comparator that compares the first control signal to the second reference current signal and develops a second control signal. Further, the in-rush current control element is adapted to limit or substantially interrupt the in-rush current as a function of the first and second control signals. The controller, therefore, is adapted to control the in-rush current control element as a function of the first and second control signals.

In one embodiment, the first and second reference current signals are derived from resistor divider networks. Resistor divider networks are commonly employed in the art to perform various functions including the task as disclosed in the present embodiment.

In one embodiment, the protection circuit further includes a overvoltage protection circuit. The protection circuit, therefore, may provide overvoltage protection in addition to current limit and short circuit protection for the power converter employing the protection circuit to advantage.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
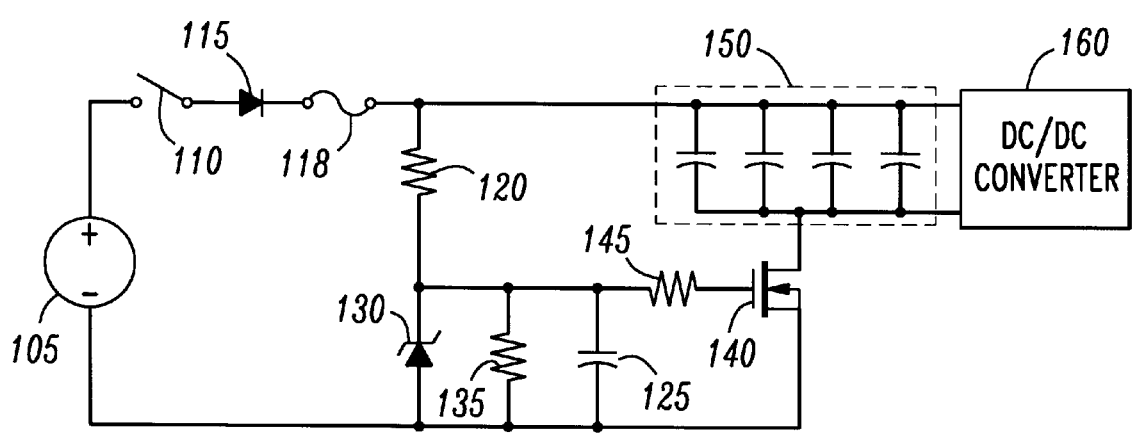
FIG. 1 illustrates a power supply employing a prior art in-rush current limit circuit.

Referring initially to FIG. 1, illustrated is a power supply 100 employing a prior art in-rush current limit circuit. The power supply 100 receives power from a DC voltage source 105, which is commonly a DC bus supplying about 48 volts DC. A switch 110, coupled to the DC voltage source 105, is used to couple and decouple the power supply 100 from the voltage source 105 and is also coupled to a isolation diode 115. The isolation diode 115 is further coupled to a fuse 118 that is commonly used to protect the DC bus when a short-circuit occurs in the power supply 100.

A timing resistor 120 is coupled to the fuse 118 and to a timing capacitor 125. The combination of the timing resistor 120 and the timing capacitor 125 form an RC timing circuit. Additionally, a parallel-coupled protection zener diode 130 and protection resistor 135 are coupled to the timing resistor 120. The parallel-coupled protection zener diode 130 and protection resistor 135 form an overvoltage protection circuit for a switch 140. The overvoltage protection value is commonly designed to be approximately 10 VDC to avoid the switch 140 from being damaged due to excessive gate voltage.

A dampening resistor 145 is coupled between the timing resistor 120 and the switch 140. The switch 140 is also coupled to an input filter 150 including a plurality of capacitors. The input filter 150 is further coupled to a DC/DC converter 160 that is capable of powering multiple loads. The switch 140, in conjunction with the RC timing circuit, form an in-rush current limit circuit. Analogous for the reasons as discussed above, the in-rush current limit circuit disclosed herein is unable to provide the comprehensive protections necessary for present power supply systems.

Figure 2:
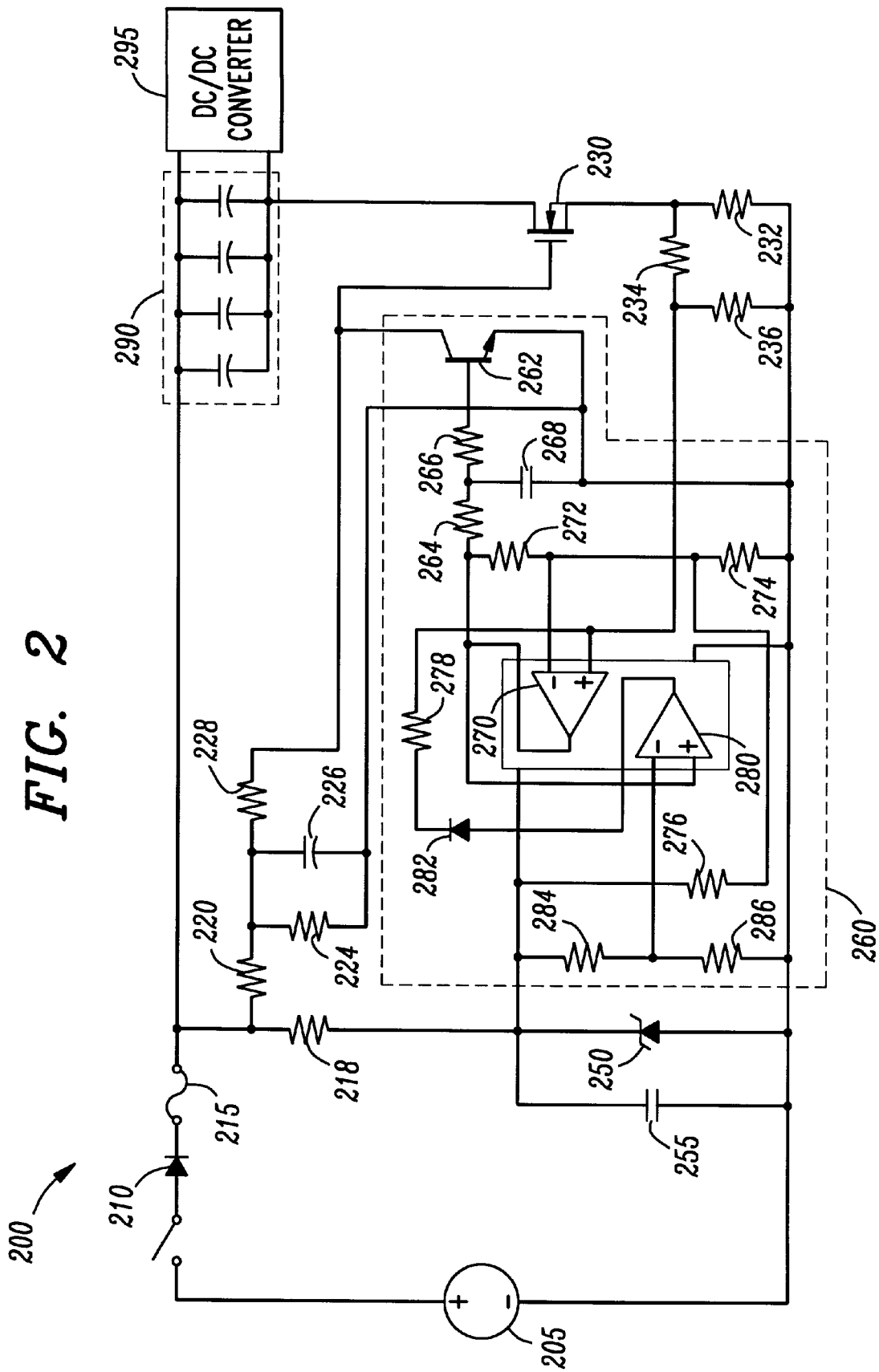
FIG. 2 illustrates an embodiment of a power supply constructed according to the principles of the present invention.

Turning now to FIG. 2, illustrated is an embodiment of a power supply 200 constructed according to the principles of the present invention. The power supply 200 receives power from a DC voltage source 205, which is commonly a DC bus supplying about 48 volts DC. An isolation diode 210 is coupled to the DC power source 205 and to a fuse 215 that is commonly used to avoid an in-rush current control element 230 from being damaged when a short-circuit occurs within the power supply 200. The fuse 215 is further coupled to an input filter circuit 290 including a plurality of capacitors. The input filter 290 is further coupled to a DC/DC converter 295 that is capable of providing multiple output voltages.

A protection circuit, coupled to the power supply 200, includes a protection resistor 218 is coupled to the fuse 215 and to a parallel-coupled protection zener diode 250 and protection capacitor 255. The protection resistor 218 and parallel-coupled protection zener diode 250 and protection capacitor 250 form an overvoltage protection circuit to protect the power supply 200 and a controller 260 from excessive bias voltage. The protection resistor 218 and protection zener diode 250 also serve as a DC bias supply to provide power to the controller 260. The protection capacitor 255 is further employed as a by-pass capacitor to filter out high frequency noise.

A first timing resistor 220 is coupled to the fuse 215 and to a parallel-coupled second timing resistor 224 and timing capacitor 226. The first and second timing resistors 220, 224 and the timing capacitor 226 work in combination to form an RC timing circuit for controlling the turn-on of the in-rush current control element 230.

A dampening resistor 228 is coupled between the first timing resistor 220 and the in-rush current control element 230. In a preferred embodiment, a metal-oxide semiconductor field-effect transistor (MOSFET) is employed as the in-rush current control element 230. Of course, other switching devices are well within the broad scope of the present invention. The in-rush current control element 230 is also coupled to the input filter circuit 290 to control current (i.e., in-rush current) flowing into the filter circuit 290.

Additionally, the protection circuit includes a sensor having a sense resistor 232, coupled to the in-rush current control element 230, that creates an intermediate signal corresponding to the current sensed therethrough. The sensor also includes the first and second differential resistors 234, 236, coupled across the sense resistor 232, that transmit the intermediate signal to a first comparator 270. In the illustrated embodiment, the control circuit includes the sensor and the controller 260.

The first comparator 270 receives the intermediate signal from the sense resistor 232 and the first and second differential resistors 234, 236 and compares it to a first reference current signal derived from a resistor divider network including first and second dividing resistors 276, 274. The first dividing resistor 276 is coupled between a first latch resistor 284 and the second dividing resistor 274. The output of the first comparator 270 is coupled to the first control resistor 264, which is further coupled to a second control resistor 266 and an intermediate control element 262. While the intermediate control element 262 is a field-effect transistor (FET), other switching devices are within the broad scope of the present invention. The first comparator 270 produces a first control signal based on the comparison between the first reference current signal and the intermediate signal. A third dividing resistor 272 is additionally coupled to the first control resistor 264. The second control resistor 266 is also coupled to the intermediate control element 262 and to a control capacitor 268. The intermediate control element 262 is further coupled to the in-rush control element 230 and to the control capacitor 268.

A second comparator 280 receives the first control signal from the first comparator 270 and compares it to a second reference current signal derived from a resistor divider including first and second latch resistors 284, 286. Further, the output of the second comparator 280 is coupled to a rectifying diode 282, which is also coupled to a feedback resistor 278. The second comparator 280 produces a second control signal based on the comparison between the first control signal and the second reference current signal. Moreover, the first latch resistor 284 is coupled to the protection resistor 218.

To protect the in-rush current control element 230 from damage due to high short circuit currents, the current through the in-rush current control element 230 is monitored by the sense resistor 232. The sense resistor 232 produces the intermediate signal, which is then delivered to the first comparator 270 by the first and second differential resistors 234, 236. The first comparator 270 then compares the intermediate signal to a first reference current signal produced by the first and second divider resistors 276, 274 and generates the first control signal.

Should the intermediate signal be higher than the first reference current signal, the first control signal causes the intermediate control element 262 to control the in-rush current control element 230 to limit the in-rush current by decreasing conductivity in the in-rush current control element 230. The first comparator 270 will only cause the in-rush current control element 230 to limit the in-rush current control element 230 to a preselected level.

The output of the first comparator 270 is also coupled to an input of the second comparator 280. When the first control signal increases in response to the intermediate signal, the second comparator 280 compares the first control signal to a second reference current signal. This second reference current signal is derived from the first and second latch resistors 284, 286. Once the first control signal increases above the level of the second reference current signal, the second control signal from the second comparator increases. Since the second control signal is coupled to one input of the first comparator 270, the additional signal delivered to the first comparator 270 will force the first control signal even higher, thus driving the intermediate control element 262 harder. As a result, the intermediate control element 262 further reduces the conductivity of the in-rush current control element 230 to such a level as to essentially disable the in-rush current control element 230, substantially interrupting the in-rush current. Thus, the control circuit 260 receives an intermediate signal from the sense resistor 232 and compares that signal to two different reference current signals. The control circuit then either directs the in-rush current control element 230 to limit or to substantially interrupt the in-rush current flowing therethrough in response to the sensed signal.

While specific embodiments of the power supply and protection circuit have been illustrated and described, other embodiments are well within the broad scope of the present invention. For a better understanding of power supplies, in general, see "Principles of Power Electronics" by John G. Kassakian, et al., Addison Wesley, Inc. (1991), and which is incorporated herein by reference.

Although the present invention has been described in detail, those skilled in the art should understand that they can make various changes, substitutions and alterations herein without departing from the spirit and scope of the invention in its broadest form.

What is claimed is:

1. For use with a protection circuit having an in-rush current control element that controls in-rush current into a power converter, a control circuit, comprising:
    a sensor, coupled to said in-rush current control element, that senses an in-rush current through said in-rush current control element and produces an intermediate signal; and
    a controller, coupled to said sensor and said in-rush current control element, that controls said in-rush current control element to limit said in-rush current when said intermediate signal exceeds a first reference current signal and to substantially interrupt said in-rush current when said intermediate signal exceeds a second reference current signal.

2. The control circuit as recited in claim 1 wherein said controller comprises an intermediate control element that controls said in-rush current control element.

3. The control circuit as recited in claim 1 wherein said controller comprises a first comparator that compares said intermediate signal to said first reference current signal and develops a first control signal and a second comparator that compares said first control signal to said second reference current signal and develops a second control signal, said controller adapted to control said in-rush current control element adapted as a function of said first and second control signals.

4. The control circuit as recited in claim 1 wherein said sensor is a resistor.

5. The control circuit as recited in claim 1 wherein said first and second reference current signals are derived from resistor divider networks.

6. The control circuit as recited in claim 1 wherein said in-rush current control element is a metal-oxide semiconductor field-effect transistor (MOSFET).

7. The control circuit as recited in claim 1 wherein said protection circuit further comprises an overvoltage protection circuit.

8. For use with a protection circuit having an in-rush current control element that controls in-rush current into a power converter, a method of controlling said in-rush current control element, comprising:
    sensing said in-rush current through said in-rush current control element;
    producing an intermediate signal derived from said sensed in-rush current;
    inducing said in-rush current control element to limit said in-rush current when said intermediate signal exceeds a first reference current signal; and
    inducing said in-rush current control element to substantially interrupt said in-rush current when said intermediate signal exceeds a second reference current.

9. The method as recited in claim 8 wherein said acts of inducing are performed by an intermediate control element.

10. The method as recited in claim 8 further comprising comparing said intermediate signal to said first reference current signal and developing a first control signal and comparing said first control signal to said second reference current signal and developing a second control signal, said acts of inducing said in-rush current control element being a function of said first and second control signals.

11. The method as recited in claim 8 wherein said sensing is performed by a resistor.

12. The method as recited in claim 8 further comprising deriving said first and second reference current signals with resistor divider networks.

13. The method as recited in claim 8 wherein said in-rush current control element is a metal-oxide semiconductor field-effect transistor (MOSFET).

14. The method as recited in claim 8 wherein said protection circuit further comprises an overvoltage protection circuit.

15. A power supply, comprising:
    a DC/DC converter;
    a filter circuit; and
    a protection circuit, including:
        an overvoltage protection circuit;
        a fuse;
        an in-rush current control element that controls an in-rush current into said filter circuit; and
        a control circuit, including:

a sensor, coupled to said in-rush current control element, that senses an in-rush current through said in-rush current control element and produces an intermediate signal; and a controller, coupled to said sensor and said in-rush current control element, that controls said in-rush current control element to limit said in-rush current when said intermediate signal exceeds a first reference current signal and to substantially interrupt said in-rush current when said intermediate signal exceeds a second reference current signal.

16. The power supply as recited in claim 15 wherein said controller comprises an intermediate control element that controls said in-rush current control element.

17. The power supply as recited in claim 15 wherein said controller comprises a first comparator that compares said intermediate signal to said first reference current signal and develops a first control signal and a second comparator that compares said first control signal to said second reference current signal and develops a second control signal, said controller adapted to control said in-rush current control element as a function of said first and second control signals.

18. The power supply as recited in claim 15 wherein said sensor is a resistor.

19. The power supply as recited in claim 15 wherein said first and second reference current signals are derived from resistor divider networks.

20. The power supply as recited in claim 15 wherein said in-rush current control element is a metal-oxide semiconductor field-effect transistor (MOSFET).

* * * * *